US011594494B2

(12) United States Patent
Zhai et al.

(10) Patent No.: US 11,594,494 B2
(45) Date of Patent: Feb. 28, 2023

(54) HIGH DENSITY INTERCONNECTION USING FANOUT INTERPOSER CHIPLET

(71) Applicant: Apple Inc., Cupertino, CA (US)

(72) Inventors: Jun Zhai, Cupertino, CA (US);
Chonghua Zhong, Cupertino, CA (US);
Kunzhong Hu, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/166,795

(22) Filed: Feb. 3, 2021

(65) Prior Publication Data

US 2021/0159180 A1   May 27, 2021

Related U.S. Application Data

(63) Continuation of application No. 15/817,054, filed on Nov. 17, 2017, now Pat. No. 10,943,869.
(Continued)

(51) Int. Cl.
*H01L 23/538* (2006.01)
*H01L 21/48* (2006.01)
(Continued)

(52) U.S. Cl.
CPC ........ *H01L 23/5385* (2013.01); *H01L 21/486* (2013.01); *H01L 21/4853* (2013.01);
(Continued)

(58) Field of Classification Search
CPC ............. H01L 23/5385; H01L 21/4853; H01L 21/486; H01L 21/6835; H01L 23/16;
(Continued)

(56) References Cited

U.S. PATENT DOCUMENTS 7,619,441 B1   11/2009   Rahman et al.
8,405,226 B2   3/2013   Knickerbocker
(Continued)

FOREIGN PATENT DOCUMENTS

JP   2016213370 A   12/2016
KR   20150120177 A   10/2015
(Continued)

OTHER PUBLICATIONS

PCT/US2018/033813, International Search Report and Written Opinion, dated Feb. 15, 2019, 30 pgs.
(Continued)

*Primary Examiner* — Selim U Ahmed
*Assistant Examiner* — Evan G Clinton
(74) *Attorney, Agent, or Firm* — Aikin & Gallant, LLP

(57) ABSTRACT

Multiple component package structures are described in which an interposer chiplet is integrated to provide fine routing between components. In an embodiment, the interposer chiplet and a plurality of conductive vias are encapsulated in an encapsulation layer. A first plurality of terminals of the first and second components may be in electrical connection with the plurality of conductive pillars and a second plurality of terminals of first and second components may be in electrical connection with the interposer chiplet.

20 Claims, 14 Drawing Sheets

Related U.S. Application Data

(60) Provisional application No. 62/517,789, filed on Jun. 9, 2017.

(51) Int. Cl.
*H01L 21/683* (2006.01)
*H01L 23/498* (2006.01)
*H01L 25/00* (2006.01)
*H01L 23/16* (2006.01)
*H01L 23/00* (2006.01)
*H01L 25/10* (2006.01)
*H01L 25/065* (2023.01)
*H01L 25/18* (2023.01)
*H01L 23/31* (2006.01)

(52) U.S. Cl.
CPC .......... *H01L 21/6835* (2013.01); *H01L 23/16* (2013.01); *H01L 23/49833* (2013.01); *H01L 23/5383* (2013.01); *H01L 23/5384* (2013.01); *H01L 23/5386* (2013.01); *H01L 24/19* (2013.01); *H01L 24/96* (2013.01); *H01L 25/0655* (2013.01); *H01L 25/105* (2013.01); *H01L 25/50* (2013.01); *H01L 21/4857* (2013.01); *H01L 23/3128* (2013.01); *H01L 23/49816* (2013.01); *H01L 23/49822* (2013.01); *H01L 23/49827* (2013.01); *H01L 24/13* (2013.01); *H01L 24/16* (2013.01); *H01L 24/17* (2013.01); *H01L 24/32* (2013.01); *H01L 24/73* (2013.01); *H01L 24/81* (2013.01); *H01L 24/92* (2013.01); *H01L 25/18* (2013.01); *H01L 2221/68359* (2013.01); *H01L 2224/0401* (2013.01); *H01L 2224/04105* (2013.01); *H01L 2224/12105* (2013.01); *H01L 2224/131* (2013.01); *H01L 2224/16227* (2013.01); *H01L 2224/16235* (2013.01); *H01L 2224/16237* (2013.01); *H01L 2224/1703* (2013.01); *H01L 2224/32225* (2013.01); *H01L 2224/73204* (2013.01); *H01L 2224/73253* (2013.01); *H01L 2224/73267* (2013.01); *H01L 2224/81005* (2013.01); *H01L 2224/92125* (2013.01); *H01L 2224/92225* (2013.01); *H01L 2224/92244* (2013.01); *H01L 2224/97* (2013.01); *H01L 2225/1023* (2013.01); *H01L 2225/1058* (2013.01); *H01L 2225/1094* (2013.01); *H01L 2924/1431* (2013.01); *H01L 2924/1432* (2013.01); *H01L 2924/1434* (2013.01); *H01L 2924/15192* (2013.01); *H01L 2924/15311* (2013.01); *H01L 2924/19011* (2013.01); *H01L 2924/19041* (2013.01); *H01L 2924/19042* (2013.01); *H01L 2924/19043* (2013.01); *H01L 2924/19105* (2013.01); *H01L 2924/3511* (2013.01); *H01L 2924/37001* (2013.01)

(58) Field of Classification Search
CPC .......... H01L 23/49833; H01L 23/5383; H01L 23/5384; H01L 23/5386; H01L 24/19; H01L 24/96; H01L 25/0655; H01L 25/105; H01L 25/50; H01L 21/4857; H01L 23/3128; H01L 23/49816; H01L 23/49822; H01L 23/49827; H01L 24/13; H01L 24/16; H01L 24/17; H01L 24/32; H01L 24/73; H01L 24/81; H01L 24/92; H01L 25/18; H01L 2221/68359; H01L 2224/0401; H01L 2224/04105; H01L 2224/12105; H01L 2224/131; H01L 2224/16227; H01L 2224/16235; H01L 2224/16237; H01L 2224/1703; H01L 2224/32225; H01L 2224/73204; H01L 2224/73253; H01L 2224/73267; H01L 2224/81005; H01L 2224/92125; H01L 2224/92225; H01L 2224/92244; H01L 2224/97; H01L 2225/1023; H01L 2225/1058; H01L 2225/1094; H01L 2924/1431; H01L 2924/1432; H01L 2924/1434; H01L 2924/15192; H01L 2924/15311; H01L 2924/19011; H01L 2924/19041; H01L 2924/19042; H01L 2924/19043; H01L 2924/19105; H01L 2924/3511; H01L 2924/37001; H01L 2224/06181; H01L 2224/73259

See application file for complete search history.

(56) References Cited

U.S. PATENT DOCUMENTS

| | | |
|---|---|---|
| 8,975,726 B2 | 3/2015 | Chen et al. |
| 8,976,047 B2 | 3/2015 | Degawa |
| 9,106,229 B1 | 8/2015 | Hutton et al. |
| 9,368,450 B1 | 6/2016 | Gu et al. |
| 9,431,347 B2 | 8/2016 | Kunieda et al. |
| 9,953,914 B2 | 4/2018 | Mohammed |
| 2003/0215993 A1 | 11/2003 | Oshima |
| 2005/0077632 A1 | 4/2005 | Hedler et al. |
| 2011/0285006 A1 | 11/2011 | Weng et al. |
| 2012/0049353 A1 | 3/2012 | Osenbach |
| 2013/0200528 A1 | 8/2013 | Lin et al. |
| 2013/0292846 A1 | 11/2013 | Lee et al. |
| 2014/0117552 A1* | 5/2014 | Qian ............... H01L 23/53228 257/762 |
| 2014/0264791 A1 | 9/2014 | Manusharow et al. |
| 2014/0360759 A1* | 12/2014 | Kunieda ............. H01L 23/5381 174/251 |
| 2015/0116965 A1 | 4/2015 | Kim et al. |
| 2015/0171015 A1 | 6/2015 | Mahajan et al. |
| 2015/0364422 A1 | 12/2015 | Zhai et al. |
| 2015/0371951 A1 | 12/2015 | Yeh et al. |
| 2016/0071818 A1 | 3/2016 | Wang et al. |
| 2016/0133552 A1 | 5/2016 | Roy et al. |
| 2016/0141234 A1 | 5/2016 | We et al. |
| 2016/0307870 A1 | 10/2016 | Kelly et al. |
| 2017/0032977 A1* | 2/2017 | Chen ................. H01L 23/5226 |
| 2017/0062383 A1 | 3/2017 | Yee et al. |
| 2017/0084555 A1 | 3/2017 | Yu et al. |
| 2017/0263518 A1* | 9/2017 | Yu ......................... H01L 24/16 |
| 2017/0365558 A1 | 12/2017 | Oh et al. |
| 2018/0102311 A1* | 4/2018 | Shih ..................... H01L 21/486 |
| 2018/0174974 A1 | 6/2018 | Kim et al. |

FOREIGN PATENT DOCUMENTS

| | | |
|---|---|---|
| TW | 201703229 A | 1/2017 |
| TW | 201705400 A | 2/2017 |
| TW | 201709473 A1 | 3/2017 |
| TW | 201725670 A | 7/2017 |
| WO | 2017078709 A1 | 5/2017 |

OTHER PUBLICATIONS

PCT/US2018/033813, Notification Concerning Transmittal of International Preliminary Report on Patentability (Chapter I of the Patent Cooperation Treaty) dated Dec. 19, 2019. 22 pgs.

PCT/US2018/033813 Invitation to Pay Additional Fees and, Where Applicable, Protest Fee, mailed Nov. 21, 2018, 17 pgs.

* cited by examiner

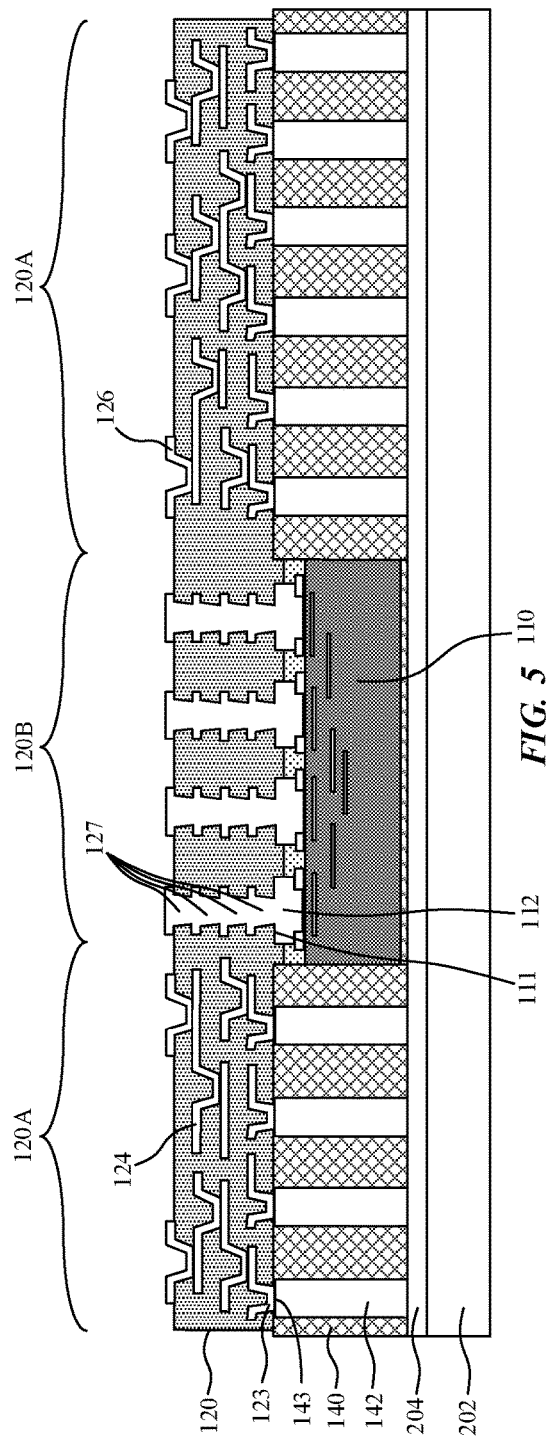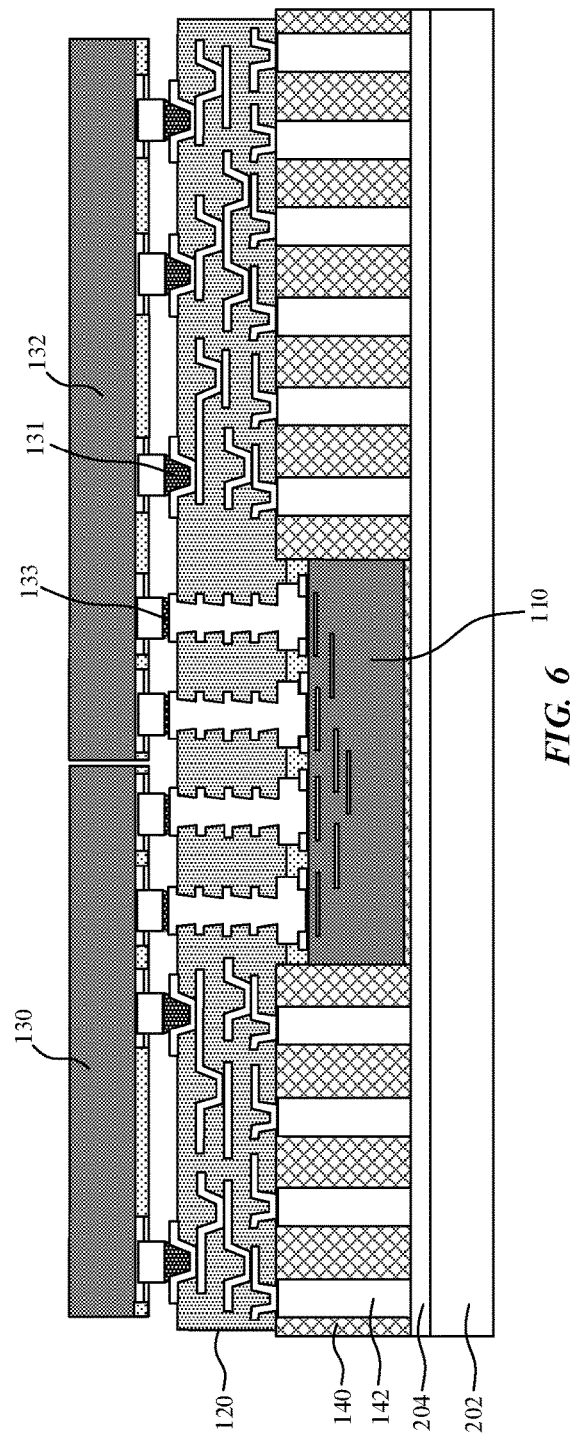
FIG. 5
FIG. 6

HIGH DENSITY INTERCONNECTION USING FANOUT INTERPOSER CHIPLET

RELATED APPLICATIONS

This application is a continuation of U.S. patent application Ser. No. 15/817,054, filed Nov. 17, 2017, which claims the benefit of priority of U.S. Provisional Application No. 62/517,789 filed Jun. 9, 2017, both which are incorporated herein by reference.

BACKGROUND

Field

Embodiments described herein relate to semiconductor packaging, and more specifically to a semiconductor package including an interposer chiplet.

Background Information

The current market demand for portable and mobile electronic devices such as mobile phones, personal digital assistants (PDAs), digital cameras, portable players, gaming, and other mobile devices requires the integration of more performance and features into increasingly smaller spaces. As a result, the input/output density of dies and number of dies integrated within a single package have increased significantly. Various 2.5D and 3D packaging solutions in particular have been proposed as multi-die packaging solutions to connect adjacent die within a single package.

SUMMARY

Multiple component package structures are described in which an interposer chiplet is integrated to provide fine routing between components. In a die-last approach in accordance with embodiments, one or more interposer chiplets and a plurality of conductive pillars may be embedded within an encapsulation layer. The plurality of conductive pillars may extend through a thickness of the encapsulation layer for electrical connection between a first side and a second side of the encapsulation layer. In an embodiment, multiple components are mounted side-by-side on the first side of the encapsulation layer. A first plurality of terminals of the first and second components are in electrical connection with the plurality of conductive pillars, and a second plurality of terminals of first and second components are in electrical connection with the interposer chiplet. The interposer chiplet interconnects the first and second components. A redistribution layer (RDL) may optionally span over the first side of the encapsulation layer, with the first and second components mounted on the a first side of the RDL opposite the encapsulation layer. Similar and other structures may also be formed in a die-first approach.

In a die-first approach in accordance with embodiments, the first and second components are embedded within an encapsulation layer, and one or more interposer chiplets is mounted on a first side of the encapsulation layer. The interposer chiplet interconnects the first and second components. In an embodiment, a first plurality of terminals of the first and second components are in electrical connection with a plurality of conductive bumps laterally adjacent the interposer chiplet, and a second plurality of terminals of first and second components are in electrical connection with the interposer chiplet.

An RDL may optionally span the first side of the encapsulation layer, with the interposer chiplet mounted on the RDL, and the plurality of conductive bumps bonded to RDL contact pads. In either configuration, the optional RDL may include a first area of fan out interconnect routing of multiple redistribution lines, and a second area of routing interconnected with the interposer chiplet. For example, the second area of routing may include stacked or offset vias. In other embodiments, conductive bumps are not placed laterally adjacent the interposer chiplet. In an embodiment, a plurality of conductive pillars are optionally plated on the RDL prior to mounting the interposer chiplet on the RDL, and the interposer chiplet and the plurality of conductive pillars are then encapsulated within a second encapsulation layer. In either the die-first or die-last approaches in accordance with embodiments conductive bumps may optionally be formed on landing pads of the RDL. Alternatively, the packages may be further process where alternative electrical connections are made with such landing pads. For example, the packages may be further integrated into an embedded wafer level packaging process.

BRIEF DESCRIPTION OF THE DRAWINGS

FIG. 5 is a cross-sectional side view illustration of a redistribution layer formed over an embedded interposer chiplet and plurality of pillars in accordance with an embodiment.

FIG. 6 is a cross-sectional side view illustration of a plurality of components mounted on a redistribution layer in accordance with an embodiment.

DETAILED DESCRIPTION

Figure 1A:
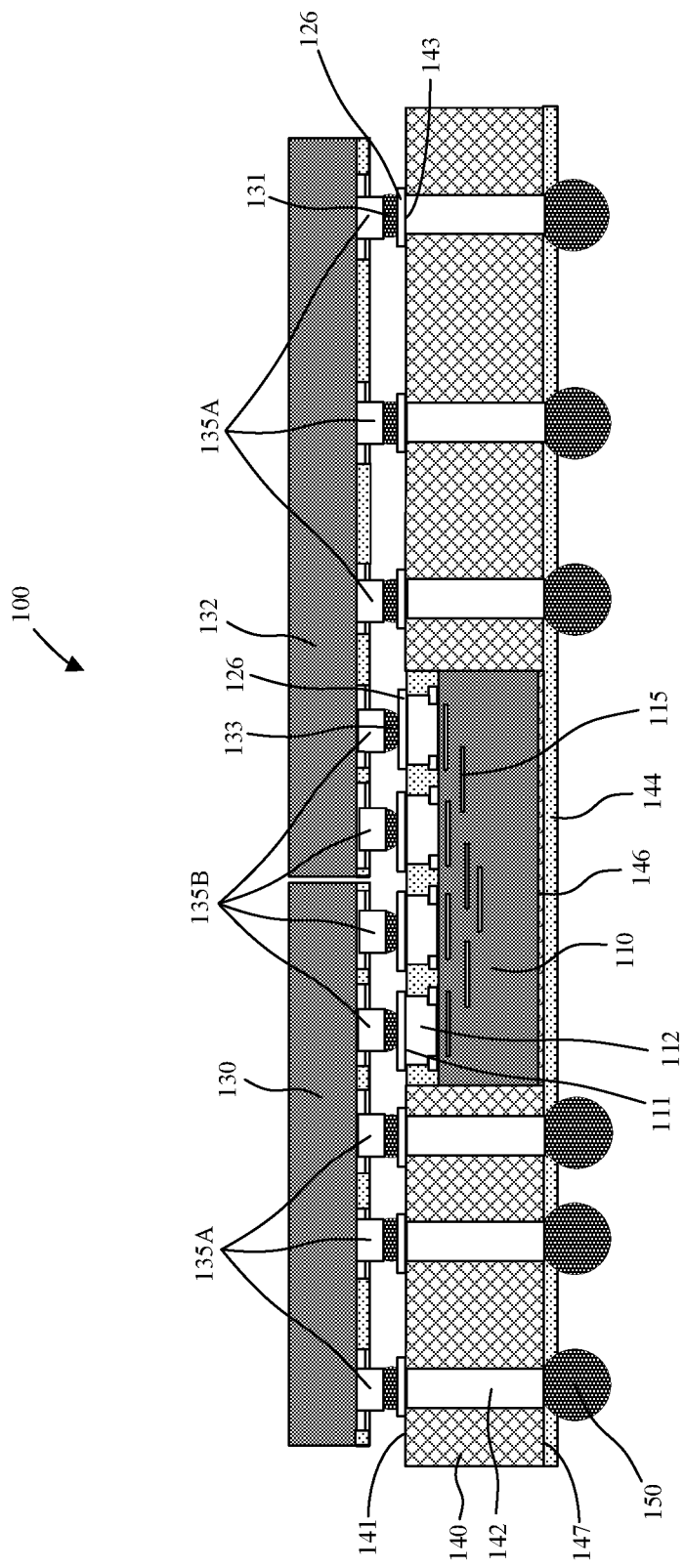
FIG. 1A is a cross-sectional side view illustration of a multi-component package including an embedded interposer chiplet in accordance with an embodiment.

Embodiments describe semiconductor packages and methods of fabrication in which an interposer chiplet is utilized to interconnect multiple components. In an embodiment, a package includes a plurality of conductive pillars and one or more interposer chiplets embedded within an encapsulation layer, and electrically connected to terminals of a first and second components. In an embodiment, a package includes a first and second components embedded within an encapsulation layer. A first plurality of the terminals of the first and second components is in electrical connection with a plurality of conductive bumps laterally adjacent to one or more interposer chiplets that are in electrical connection with a second plurality of terminals of the first and second components. In both embodiments, the one or more interposer chiplets interconnect the first and second components. In both embodiments, a redistribution layer (RDL) may optionally be located between the layer including the first and second components, and the layer including the interposer chiplet and optionally the plurality of conductive pillars.

In one aspect, the interposer chiplet includes fine pitch component-to-component routing while the optional RDL includes coarser pitch fan out routing for the package. In this manner, the cost and complexity of including fine pitch routing within the RDL can be avoided. Additionally, it is not necessary to include an interposer with through silicon vias (TSVs) within the package.

In another aspect, some embodiments describe packaging methods, which may have a positive effect on package yield. The packaging methods may also be compatible with packaging process sequences such as chip-on-wafer-on-silicon that commonly utilize a silicon interposer. Thus, the optional RDL and embedded interposer chiplet in accordance with embodiments can be manufactured with wafer level design rules, while replacing conventional interposers in a packaging sequence.

In another aspect, embodiments describe interposer chiplet configurations which may optionally include an integrated passive device, such as resistor, inductor, capacitor, etc. Various modifications and variations for integrating an interposer chiplet within a package are contemplated in accordance with embodiments. The packages may additionally include a backside RDL, combinations of the same or different components, and addition of a heat spreader, stiffener ring, or embedded active die.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "over", "to", "between", "spanning" and "on" as used herein may refer to a relative position of one layer with respect to other layers. One layer "over", "spanning" or "on" another layer or bonded "to" or in "contact" with another layer may be directly in contact with the other layer or may have one or more intervening layers. One layer "between" layers may be directly in contact with the layers or may have one or more intervening layers.

Referring now to FIG. 1A a cross-sectional side view illustration is provided of a multi-component package including an embedded interposer chiplet in accordance with an embodiment. As shown, the package 100 may include an interposer chiplet 110 and a plurality of conductive pillars 142 embedded within an encapsulation layer 140. The plurality of conductive pillars 142 may extend through a thickness of the encapsulation layer for electrical connection between a first side 141 and a second side 147 of the encapsulation layer 140. In an embodiment, multiple components 130, 132 are mounted side-by-side on the first side 141 of the encapsulation layer 140. A first plurality of terminals 135A of the first and second components are in electrical connection with the plurality of conductive pillars 142, and a second plurality of terminals 135B of first and second components are in electrical connection with the interposer chiplet 110. The interposer chiplet 110 interconnects the first and second components 130, 132. In accordance with embodiments, the first and second components 130, 132 may be dies or packages, or a combination thereof. In an embodiment, the interposer chiplet 110 optionally includes an integrated passive device, such as resistor, inductor, capacitor, etc.

A plurality of conductive pillars 142 may extend through a thickness of the encapsulation layer 140. In an embodiment, a plurality of conductive bumps 150 (e.g. solder bumps, C4) are bonded to the plurality of conductive pillars 142. As shown, a protection layer 144 may optionally underlie the plurality of conductive pillars 142 and the interposer chiplet 110. Openings may optionally be formed through the protection layer 144 to expose the plurality of conductive pillars 142. Additionally, a die attach film 146 may optionally be present as a result of an interposer chiplet 110 attach operation. In an embodiment, a plurality of contact pads 126 are optionally formed on the first side 141 of the encapsulation layer 140. The first and second components 130, 132 may optionally be bonded to the plurality of contact pads 126, or directly on the exposed surfaces 111 of interposer chiplet 110 landing pads 112 and exposed surfaces 143 of conductive pillars 142.

Figure 1B:
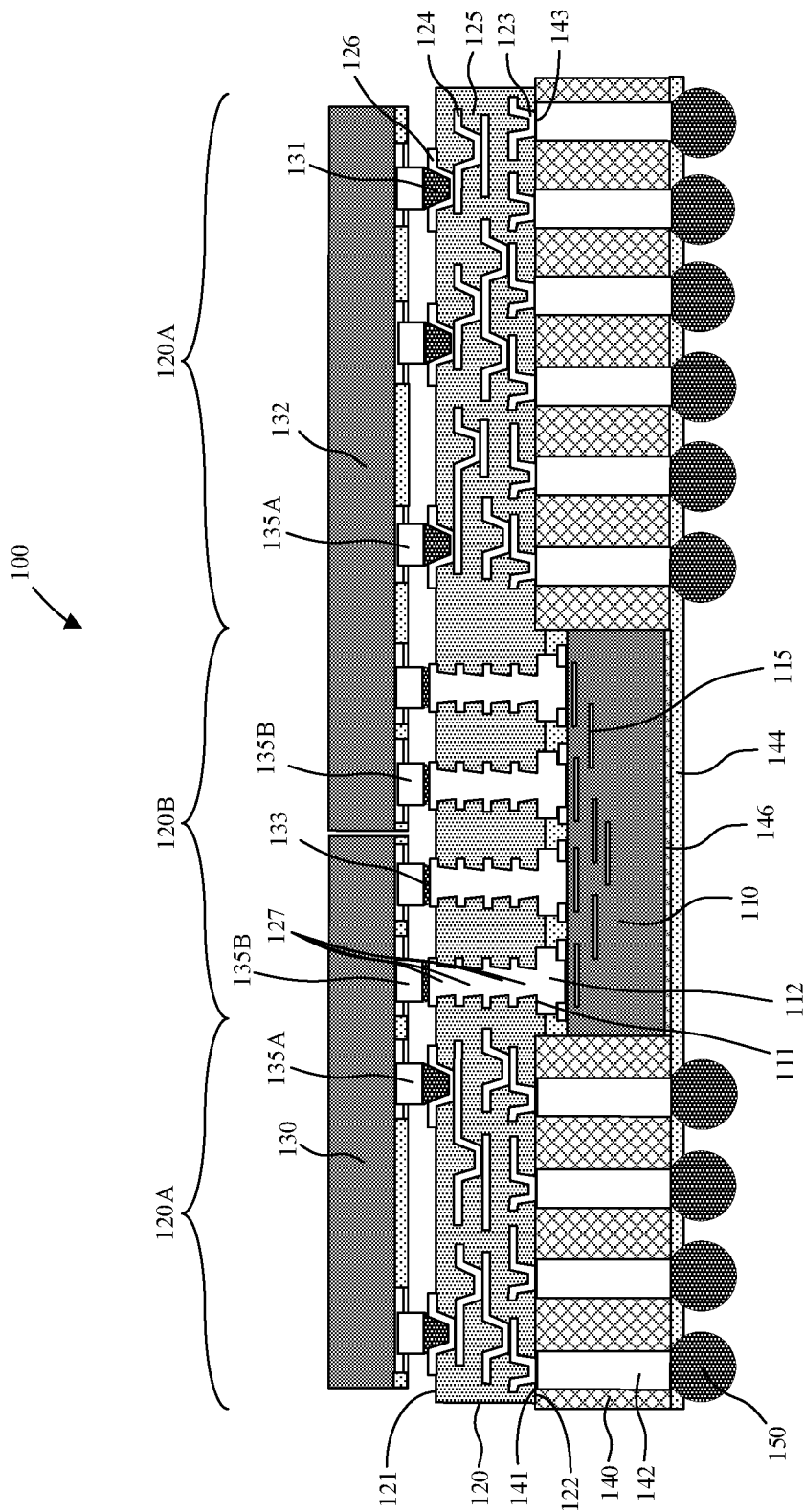
FIG. 1B is a cross-sectional side view illustration of a multi-component package including an embedded interposer chiplet and redistribution layer in accordance with an embodiment.

Referring now to FIG. 1B a cross-sectional side view illustration is provided of a multi-component package including an embedded interposer chiplet and RDL in accordance with an embodiment. As shown, RDL 120 may optionally span over the first side 141 of the encapsulation layer 140, with the first and second components 130, 132 mounted on a first side 121 of the RDL 120 opposite the encapsulation layer 140. In an embodiment, the package 100 includes an RDL 120, a first component 130 (e.g. die or package) and a second component 132 (e.g. die or package) mounted on a first side 121 of the RDL 120. An encapsulation layer 140 spans over a second side 122 of the RDL 120 opposite the first side 121. The interposer chiplet 110 is embedded within the encapsulation layer 140 on the second side 122 of the RDL 120. In accordance with embodiments, the interposer chiplet 110 interconnects the first and second components 130, 132. In an embodiment, the interposer chiplet 110 optionally includes an integrated passive device, such as resistor, inductor, capacitor, etc.

The RDL 120 may one or more redistribution lines 124 and passivation layers 125. The material of redistribution lines 124 can be formed from a metallic material such as: copper (Cu); titanium (Ti); nickel (Ni); gold (Au); a combination of at least one of Ti, Ni, Au, or Cu; or other suitable metals, alloys, or combinations of metals and/or alloys. A passivation layer 125 can be any suitable insulating materials such as an oxide, or polymer (e.g. polyimide). In an embodiment, a redistribution line 124 can include contact pads 123 formed directly on exposed surfaces 143 of conductive pillars 142. Redistribution lines 124 may be formed using a suitable technique such as sputtering, followed by etching. Multiple redistribution lines 124 and passivation layers 125 can be formed within RDL 120 using a sequence of deposition and patterning. In an embodiment, the first side 121 of the RDL 120 includes contact pads or under bump metallurgy (UBM) pads 126. In the embodiment illustrated, the RDL 120 additionally includes a plurality of stacked or offset vias 127. The stacked or offset vias 127 may also be formed directly on exposed surfaces 111 of interposer chiplet 110 landing pads 112. The opposite side of the stacked or offset vias 127 may additionally include contact pads 126 (e.g. UBM pads).

In an embodiment, the RDL 120 may include a first area 120A of fan out interconnect routing of the multiple redistribution lines 124 interconnected with the plurality of conductive pillars 142, and a second area 120B of routing interconnected with the interposer chiplet 110. For example the second area 120B of routing may include stacked or offset vias 127. The interposer chiplet 110 may include interposer routing 115 characterized by a finer pitch than the RDL 120 fan out interconnect routing of the multiple redistribution lines 124. The arrangement of stacked or offset vias 127 may extend through the RDL 120 to interconnect the interposer chiplet 110 with the first and second components 130, 132.

In an embodiment, a first plurality of conductive bumps 131 (e.g. solder) connect the first and second components 130, 132 to the RDL 120, and a second plurality of conductive bumps 133 (e.g. micro-bumps; solder) connect the first and second components 130, 132 to the RDL 120. More specifically, second plurality of conductive bumps 133 is interconnected with the interposer chiplet 110 through the arrangement of stacked or offset vias 127 extending through the RDL 120, while the first plurality of conductive bumps 131 is interconnected with the plurality of conductive pillars 142 that extend through a thickness of the encapsulation layer 140 by the fan out interconnect routing of the multiple redistribution lines 124. The first plurality of conductive bumps 131 may have a coarser pitch than the second plurality of conductive bumps 133 in some embodiments, though they may also have similar pitches.

Figure 2:
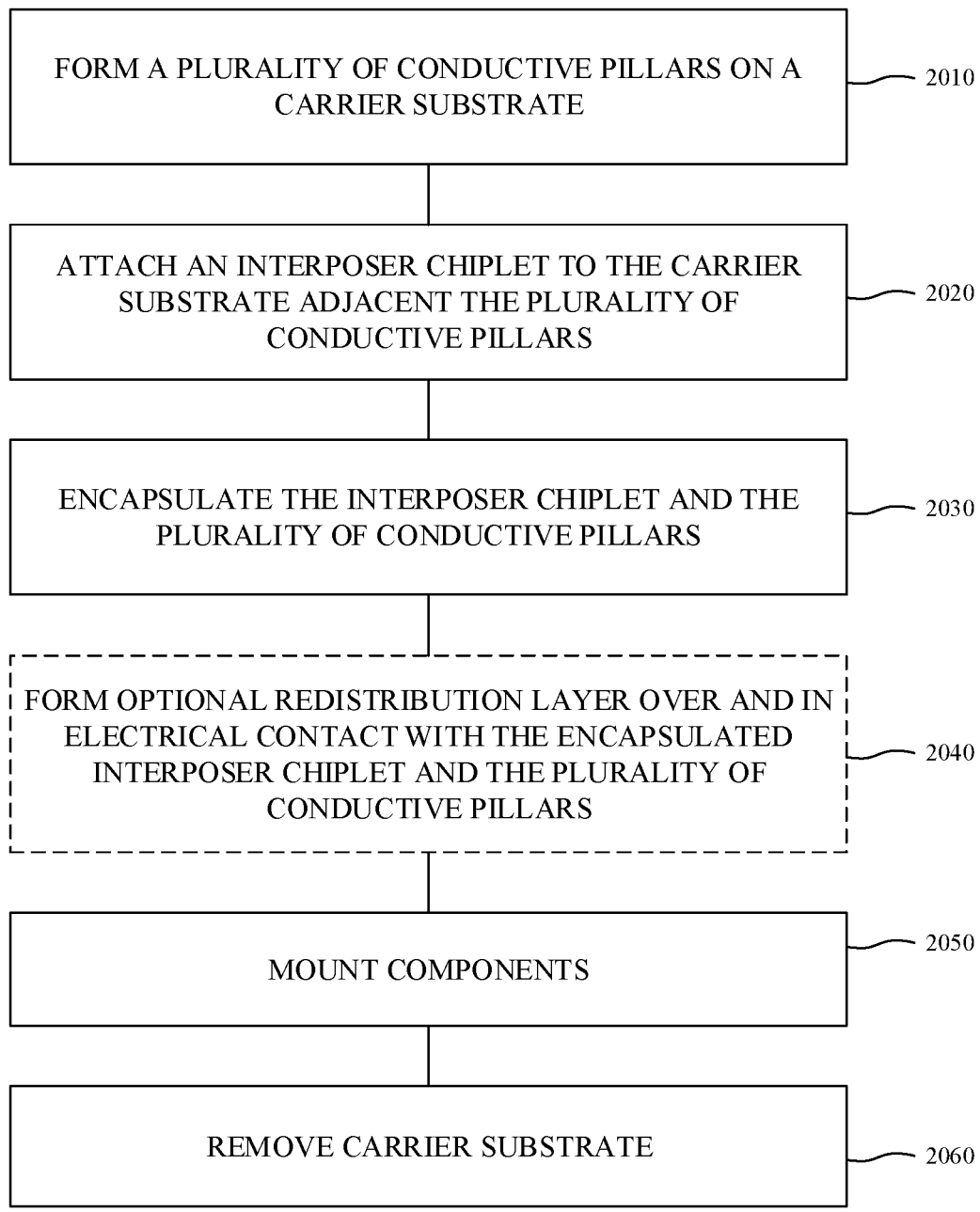
FIG. 2 is a process flow of a method of forming a multi-component package including an embedded interposer chiplet in accordance with an embodiment.

FIG. 2 is a process flow of a method of forming a multi-component package 100 including an embedded interposer chiplet 110 such as that illustrated in FIGS. 1A-1B in accordance with embodiments. In interests of conciseness, the process flow provided in FIG. 2 is described concurrently with the cross-sectional side view illustrations provided in FIGS. 3-6.

Figure 3:
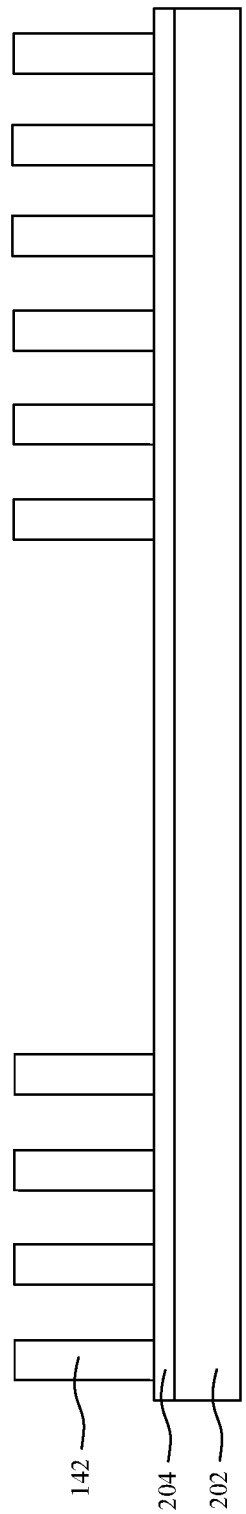
FIG. 3 is a cross-sectional side view illustration of a plurality of pillars formed on a carrier substrate in accordance with an embodiment.

Referring now to FIG. 3, at operation 2010 a plurality of conductive pillars 142 are formed on a carrier substrate 202. The material of conductive pillars 142 can include, but is not limited to, a metallic material such as copper, titanium, nickel, gold, and combinations or alloys thereof. Conductive pillars 142 may be formed using a suitable processing technique, and may be formed of a variety of suitable materials (e.g. copper) and layers. In an embodiment, conductive pillars 142 are formed by a plating technique, such as electroplating using a patterned photoresist layer to define the pillar structure dimensions, followed by removal of the patterned photoresist layer. Carrier substrate 202 may be a variety of substrates such as silicon or glass. An optional conductive layer 204 may additionally be included to facilitate plating of the conductive pillars 142.

Figure 4:
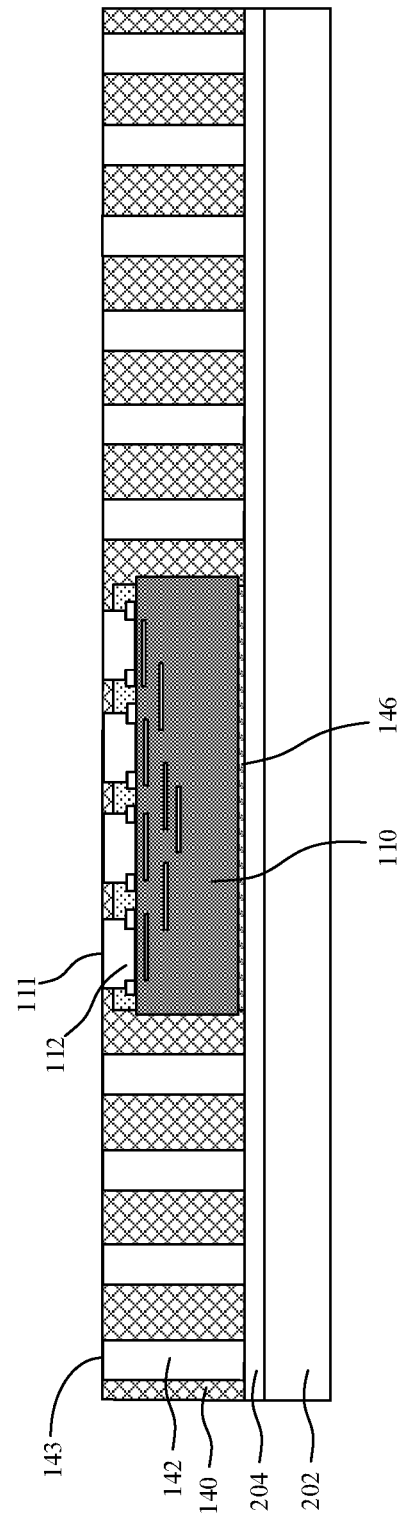
FIG. 4 is a cross-sectional side view illustration of an interposer chiplet mounted onto a carrier substrate adjacent a plurality of pillars in accordance with an embodiment.

Referring to FIG. 4, at operation 2020 an interposer chiplet 110 is then attached to the carrier substrate 202 adjacent the plurality of conductive pillars 142. For example, this may be accomplished using an optional die attach film 146. The interposer chiplet 110 and plurality of conductive pillars 142 are then encapsulated in an encapsulation layer 140 at operation 2030. In accordance with embodiments, the encapsulation layer 140 may be formed utilizing dry film techniques (e.g. lamination) or liquid based techniques (e.g. cured films). For example, encapsulation layer 140 may be any suitable molding compound commonly used in electronic packaging. In an embodiment, the encapsulation layer 140 is planarized to expose surfaces 143 of the plurality of conductive pillars 142 and surfaces 111 of the landing pads 112 of the interposer chiplet 110. For example, landing pads 112 may be metallic stud bumps. Contact pads 126 (e.g. UBM pads) are optionally formed on the exposed surfaces 143 of the plurality of conductive pillars 142 and surfaces 111 of the landing pads 112 of the interposer chiplet 110. In accordance with embodiments, the structure provided in FIG. 4 may be formed at wafer scale. Testing may additionally be performed to verify the electrical connections of the plurality of conductive pillars 142 and interposer chiplet 110.

Referring now to FIG. 5, at operation 2040 an RDL 120 is optionally formed over and in electrical contact with the encapsulated interposer chiplet 110 and the plurality of conductive pillars 142. Forming the RDL 120 may include forming a first area 120A of fan out interconnect routing of redistribution lines 124 interconnected with the plurality of conductive pillars 142, and a second area 120B of routing (e.g. stacked or offset vias 127) interconnected with the interposer chiplet 110. The interposer chiplet 110 may include interposer routing characterized by a finer pitch than the RDL fan out interconnect routing of redistribution lines 124. In an embodiment, a redistribution line 124 can include contact pads 123 formed directly on an exposed surface 143 of a conductive pillar 142. The stacked or offset vias 127 may also be formed directly on exposed surfaces 111 of interposer chiplet 110 landing pads 112. In accordance with embodiments, the structure provided in FIG. 5 may be formed at wafer scale. Testing may additionally be performed to verify the electrical connections within the RDL 120, and interposer chiplet 110.

Referring now to FIG. 6, at operation 2050 the first and second components 130, 132 are then mounted. In a first embodiment such as that illustrated in FIG. 1A, the first and second components 130, 132 are mounted on the conductive pillars 142, landing pads 112, or contact pads 126 formed thereon. In a second embodiment such as that illustrated in FIG. 1B, the first and second components 130, 132 are mounted on the RDL 120. In accordance with embodiments, the first and second components 130, 132 may be attached using a suitable technique such as flip chip bonding and use of conductive bumps 131, 133 (e.g. solder). In an embodiment, the second plurality of conductive bumps 133 are micro-bumps, and may be smaller than the first plurality of conductive bumps 131. It is to be appreciated that component attachment may also be performed at the wafer scale, including a large number of components. In an embodiment, the first and second components 130, 132 are the same type of die or package. For example, they may both be a logic die or package (e.g. CPU, GPU, SoC, etc.) or memory die or package. In an embodiment, the first and second components 130, 132 may be different types of die or packages, or a combination of die and package. In an embodiment, the first component 130 is a CPU die or package, while the second component 132 is a GPU die or package.

Following mounting of the components, the first and second components 130, 132 may optionally be underfilled, or overmolded with a molding compound to protect the mechanical or chemical integrity of the bonded structure. The carrier substrate 202 and optional conductive layer 204 may then be removed at operation 2060. In an embodiment, an optional protection layer 144 may be formed following by bonding a plurality of conductive bumps 150 (e.g. solder bumps, C4) to the plurality of conductive pillars 142, and dicing of individual packages 100, resulting in the structures illustrated in FIGS. 1A-1B.

In the following description of FIGS. 7-12C several package variations are provided. It is to be appreciated that embodiments are not limited to the specific configurations illustrated, and that several of the package variations may be combined within a single embodiment. Additionally, while the specific package variations illustrated include RDL 120, the RDL is optional. Accordingly, the following package variations are understood to be illustrative, rather than limiting.

Figure 7:
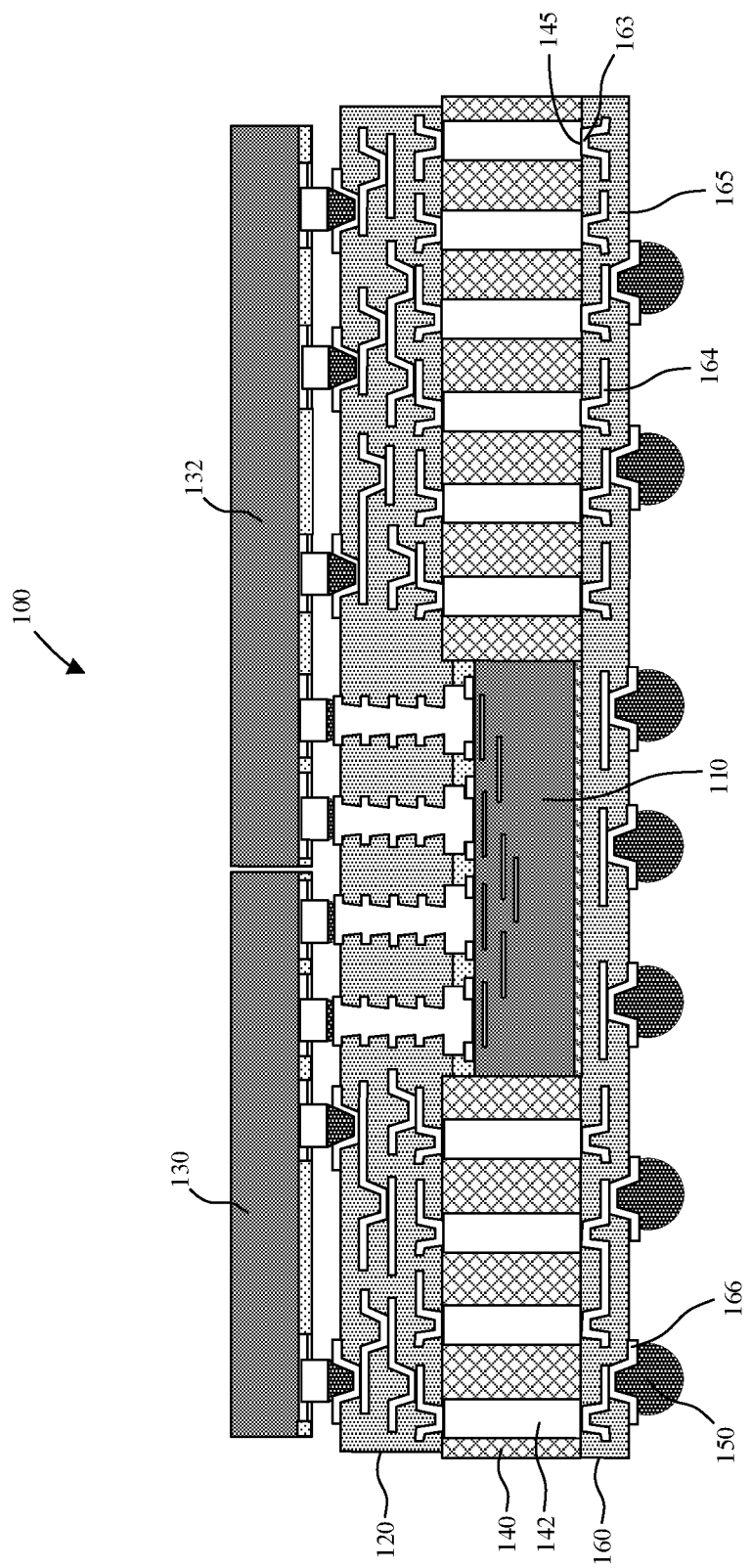
FIG. 7 is a cross-sectional side view illustration of multi-component package including an embedded interposer chiplet and back side redistribution layer in accordance with an embodiment.

FIG. 7 is a cross-sectional side view illustration of multi-component package 100 including an embedded interposer chiplet 110 and back side RDL 160 in accordance with an embodiment. In such an embodiment, the back side RDL 160 may be formed after removal of the carrier substrate 202. Back side RDL 160 may include one or more redistribution lines 164 and passivation layers 165. In an embodiment, a redistribution line 164 can include contact pads 163 formed directly on an exposed surface 145 of a conductive pillar 142. In an embodiment, back side of the back side RDL 160 may also include contact pads or under bump metallurgy (UBM) pads 166 to receive conductive bumps 150.

Figure 8:
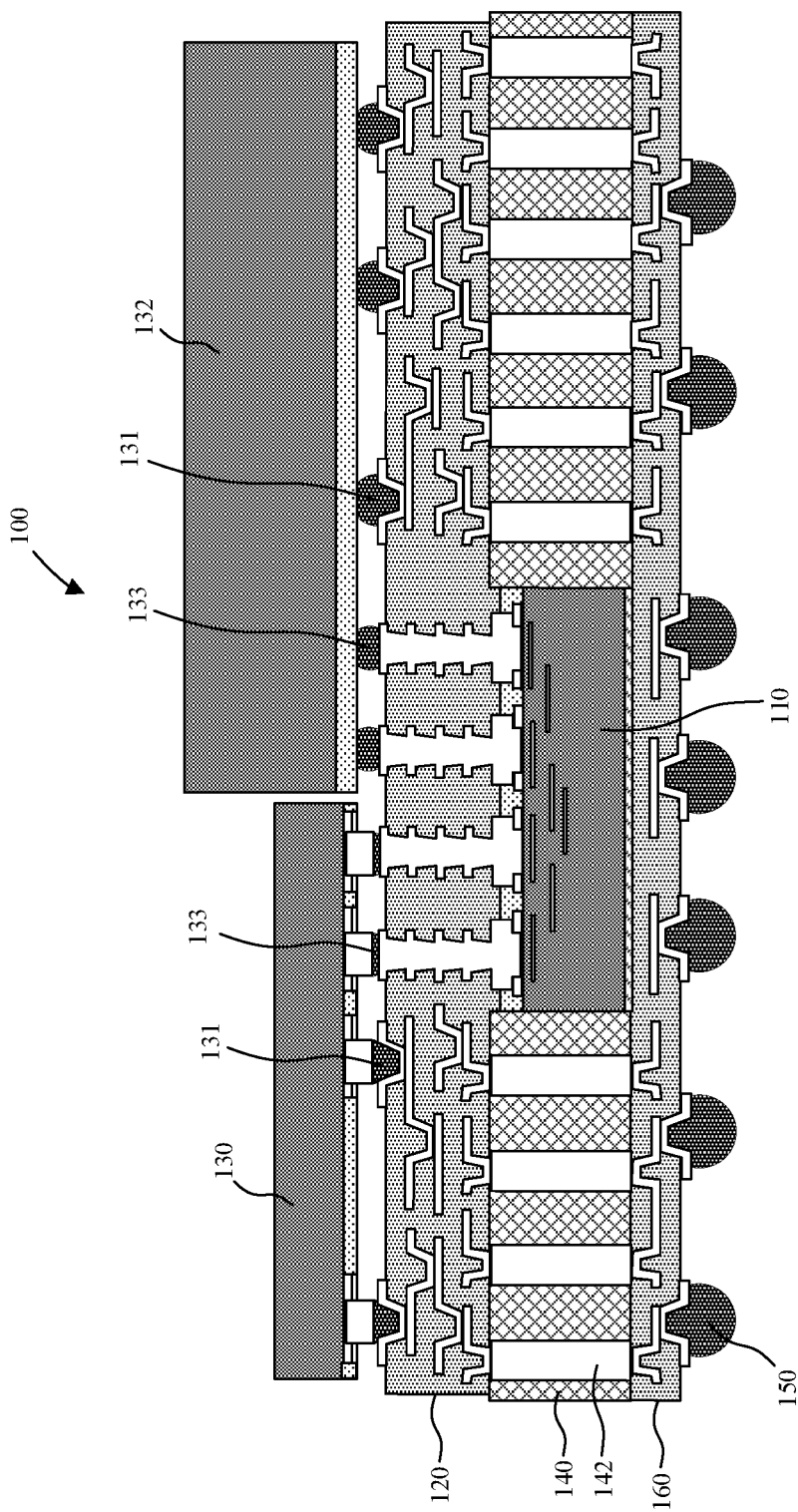
FIG. 8 is a cross-sectional side view illustration of package including multiple different dies and an embedded interposer chiplet in accordance with an embodiment.

Up until this point, it has been described that the first and second components 130, 132 may be different types of die or packages, or a combination of die and package. FIG. 8 is a cross-sectional side view illustration of package 100 including multiple different dies or packages and an embedded interposer chiplet in accordance with an embodiment. As shown, the first and second components 130, 132 include different dimensions. In an embodiment, the first component 130 is a die, while the second component 132 is a package. Thus, the interposer chiplet 110 may provide fine routing between a die and package in accordance with an embodiment.

Figure 9:
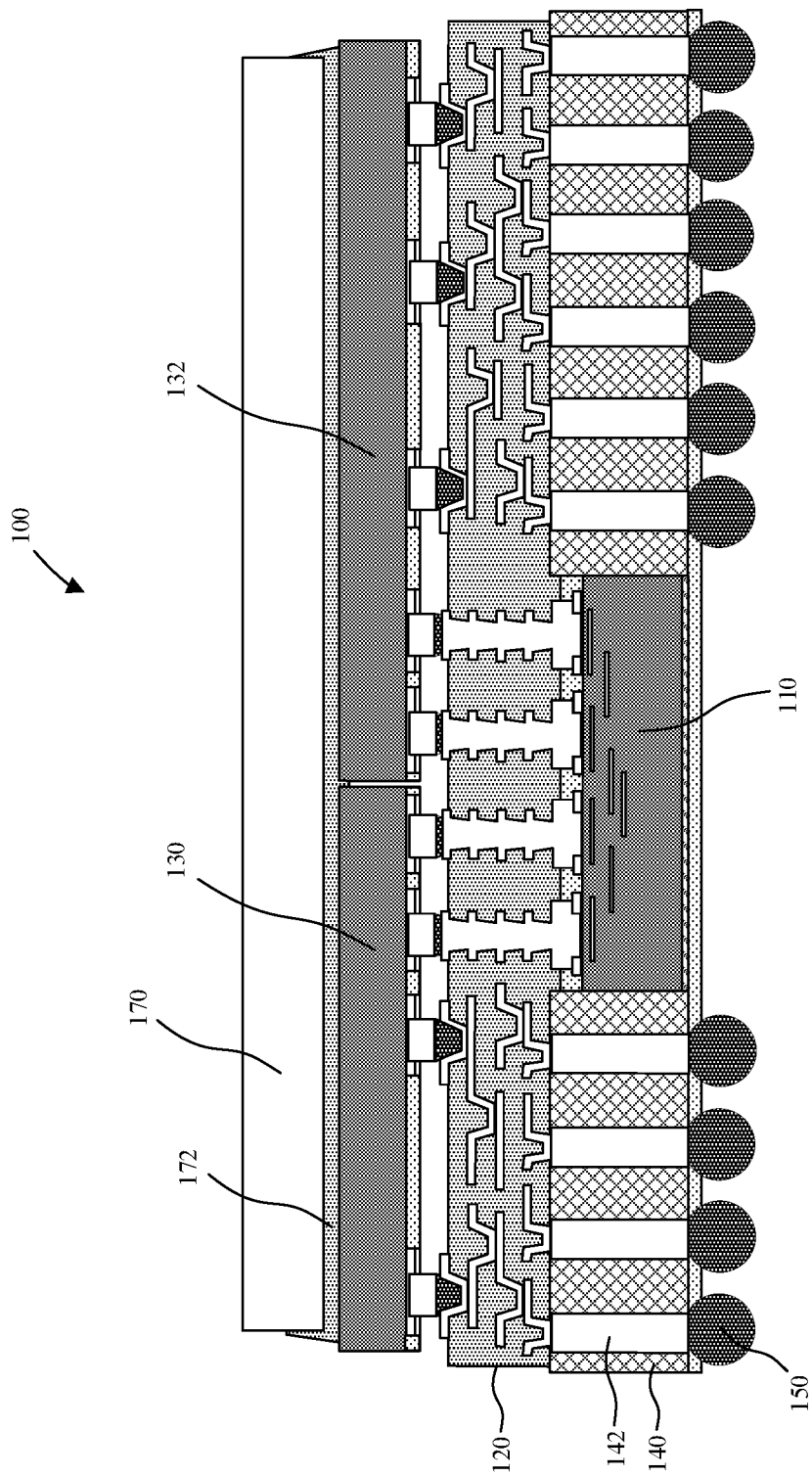
FIG. 9 is a cross-sectional side view illustration of multi-component package including an embedded interposer chiplet and heat spreader in accordance with an embodiment.

FIG. 9 is a cross-sectional side view illustration of multi-component package 100 including an embedded interposer chiplet 110 and heat spreader 170 in accordance with an embodiment. As shown, a heat spreader 170 may be secured onto multiple component 130, 132 and secured using a thermally conductive underfill material 172, for example.

Figure 10:
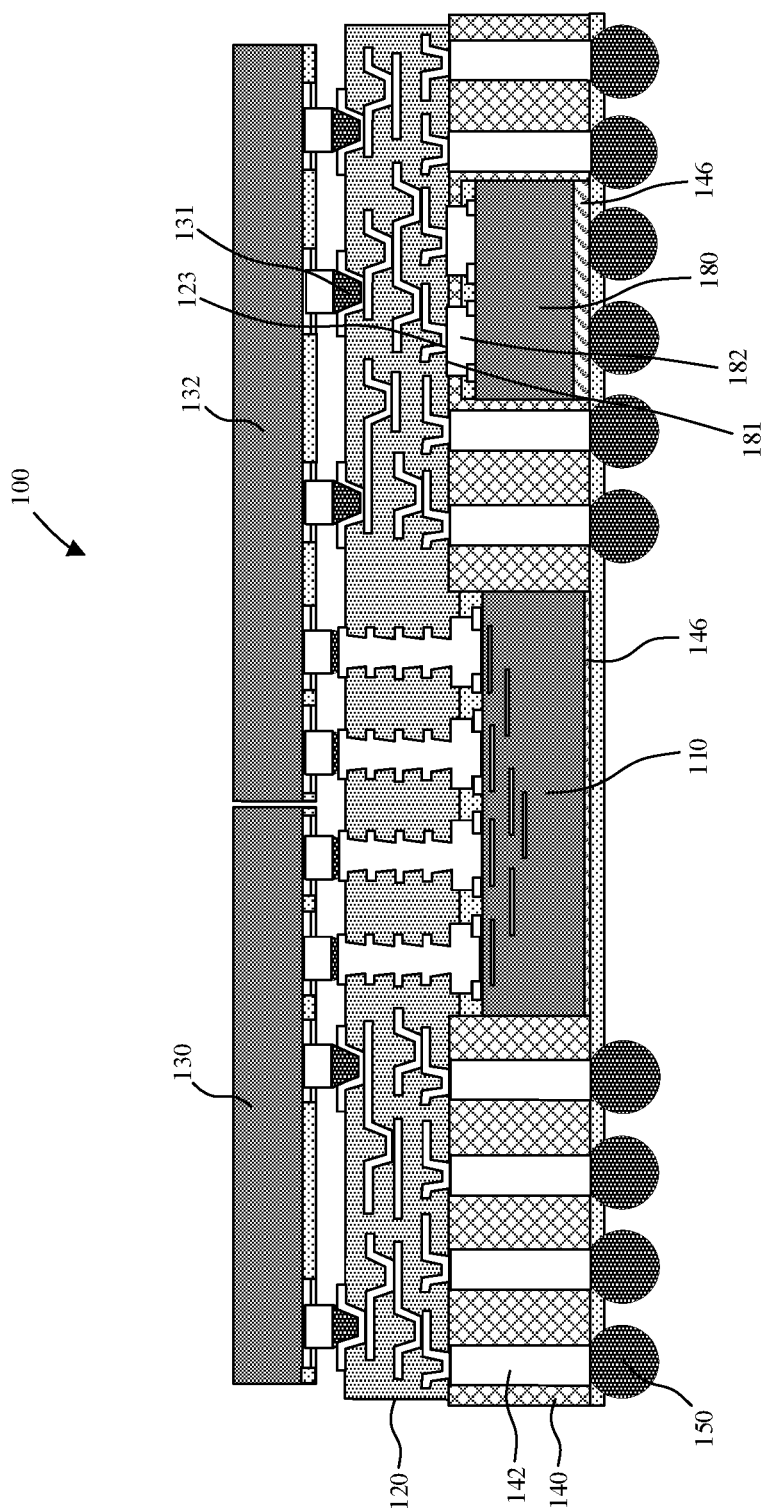
FIG. 10 is a cross-sectional side view illustration of multi-component package including an embedded interposer chiplet and embedded die in accordance with an embodiment.

FIG. 10 is a cross-sectional side view illustration of multi-component package 100 including an embedded interposer chiplet 110 and embedded die 180 in accordance with an embodiment. The die 180 may be integrated similarly as the interposer chiplet 110. For example, the die 180 may be attached using a die attach film 146. Similarly, the optional RDL 120 may include a contact pad 123 formed directly on an exposed surface 181 of a landing pad 182 (e.g. metallic stud bump). Where RDL 120 is not present, conductive pumps 131 can be bonded to the landing pads 182, or contact pads 126 formed thereon. In an embodiment, the embedded die 180 is included for a power delivery purpose, for example, when first and second components 130, 132 include processor dies such as CPU and/or GPU.

Figure 11:
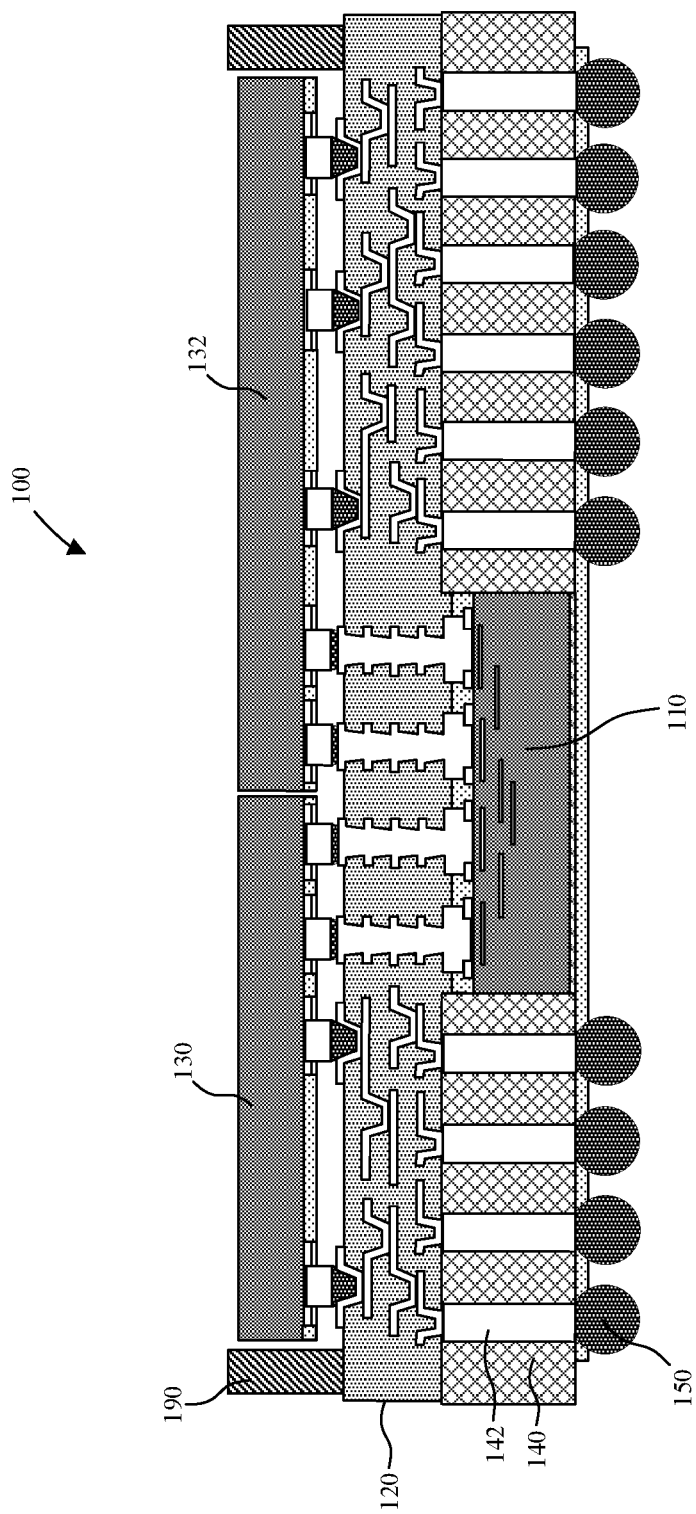
FIG. 11 is a cross-sectional side view illustration of multi-component package including an embedded interposer chiplet and stiffener ring in accordance with an embodiment.

FIG. 11 is a cross-sectional side view illustration of multi-component package 100 including an embedded interposer chiplet 110 and stiffener ring 190 in accordance with an embodiment. In such an embodiment, a stiffer ring 190 may optionally be attached after mounting of components 130, 132, and prior to detachment of the carrier substrate 202.

Figure 12A:
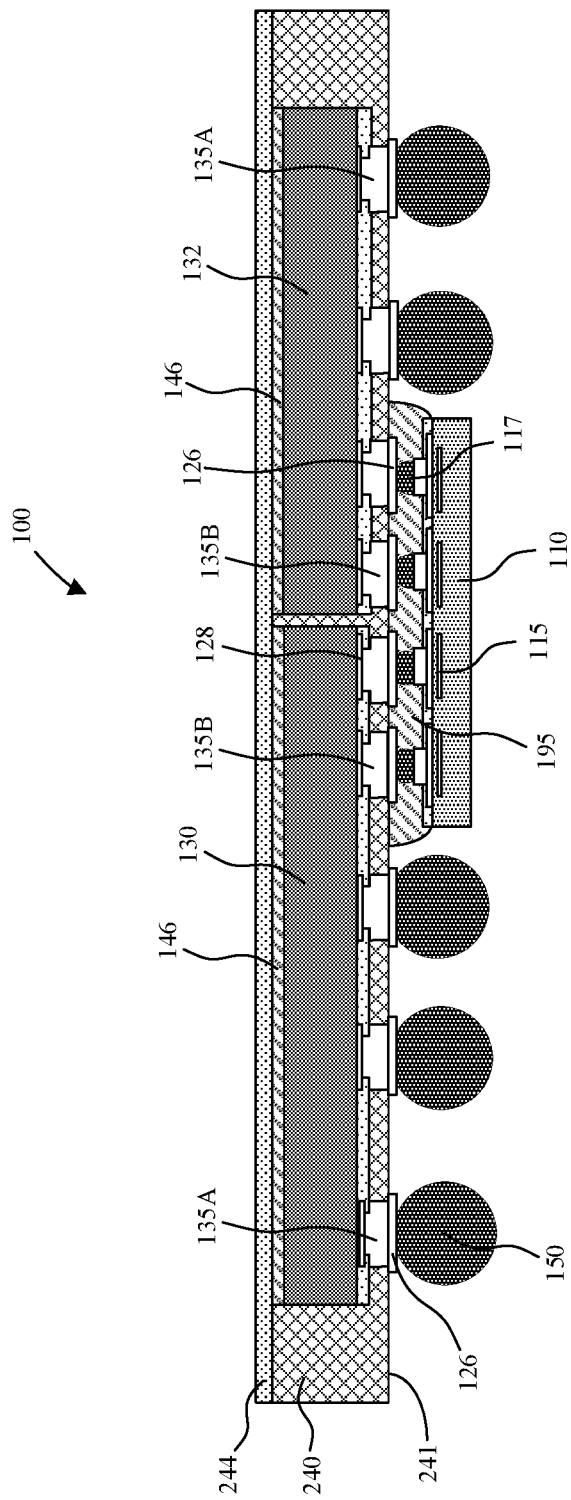
FIG. 12A is a cross-sectional side view illustration of multi-component package including an interposer chiplet in accordance with an embodiment.

FIG. 12A is a cross-sectional side view illustration of multi-component package 100 including a interposer chiplet 110 in accordance with an embodiment. In a specific embodiment, the interposer chiplet 110 includes an integrated passive device. As illustrated, the package 100 may include an encapsulation layer 240, and a first and second components 130, 132 embedded within the encapsulation layer 240. An interposer chiplet 110 is mounted on a first side 241 of the encapsulation layer 240. A first plurality of terminals 135A of the first and second components 130, 132 are in electrical connection with a plurality of conductive bumps 150 laterally adjacent the interposer chiplet 110, and a second plurality of terminals 135B of first and second components 130, 132 are in electrical connection with the interposer chiplet 110. The interposer chiplet 110 interconnects the first and second components 130, 132. As shown an underfill material 195 may optionally be applied between the interposer chiplet 110 and the encapsulation layer 240, as well as around the conductive bumps 117 (e.g. microbumps; solder). A protection layer 244 may optionally be formed over the first and second components 130, 132.

Figure 12B:
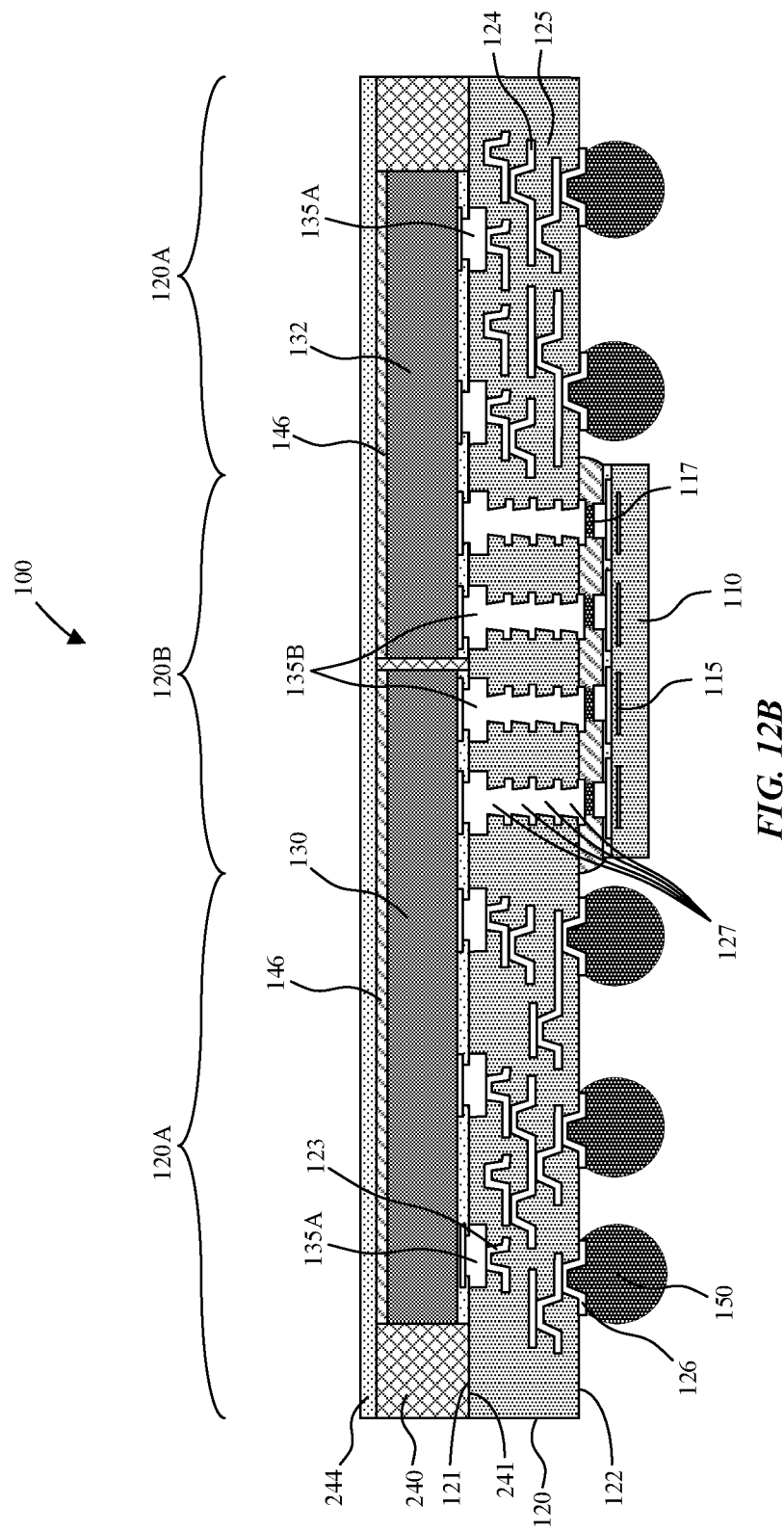
FIG. 12B is a cross-sectional side view illustration of multi-component package including an interposer chiplet and redistribution layer in accordance with an embodiment.

FIG. 12B is a cross-sectional side view illustration of multi-component package 100 including a interposer chiplet 110 and RDL 120 in accordance with an embodiment. As shown, the RDL 120 may be on the first side 241 of the encapsulation layer 240, and include a first area 120A of fan out interconnect routing that is interconnected with the first and second components 130, 132, and a second area 120B of routing that interconnects the first and second components 130, 132 with the interposer chiplet 110. In an embodiment, the interposer chiplet 110 is mounted on the RDL 120, and the plurality of conductive bumps 150 are bonded to RDL contact pads 126 of the first area 120A of fan out interconnect routing. In an embodiment, the package 100 includes RDL 120, a first component 130 (e.g. die or package) and a second component 132 (e.g. die or package) attached to a first side 121 of the RDL 120. An encapsulation layer 140 spans over the first side 121 of the RDL 120 and encapsulates the first and second components 130, 132. An interposer chiplet 110 is mounted on a second side 122 of the RDL 120. In an embodiment, the interposer chiplet 110 interconnects the first and second components 130, 132 Similar to previous descriptions, the RDL 120 may include a first area 120A of fan out interconnect routing interconnected with the first and second components 130, 132, and a second area 120B of routing (e.g. stacked or offset vias 127) that interconnects the first and second components 130, 132 with the interposer chiplet 110.

In the particular embodiment illustrated in FIG. 12B, a plurality of conductive bumps 150 (e.g. solder bumps, C4) are bonded to the contact pads or UBM contact pads 126 of the RDL 120 such that they are laterally adjacent the interposer chiplet 110. The interposer chiplet 110 may be mounted directly on the stacked or offset vias 127, or contact pads 126 on vias 127 with a plurality of conductive bumps 117 (e.g. micro-bumps; solder), which are substantially smaller than the conductive bumps 150 for the package 100. The interposer chiplet 110 may include interposer routing 115 characterized by a finer pitch than the RDL 120 fan out interconnect routing of the multiple redistribution lines 124. The arrangement of stacked or offset vias 127 may extend through the RDL 120 to interconnect the interposer chiplet 110 with the first and second components 130, 132. The interposer chiplet may optionally include an integrated passive device in accordance with embodiments.

Figure 12C:
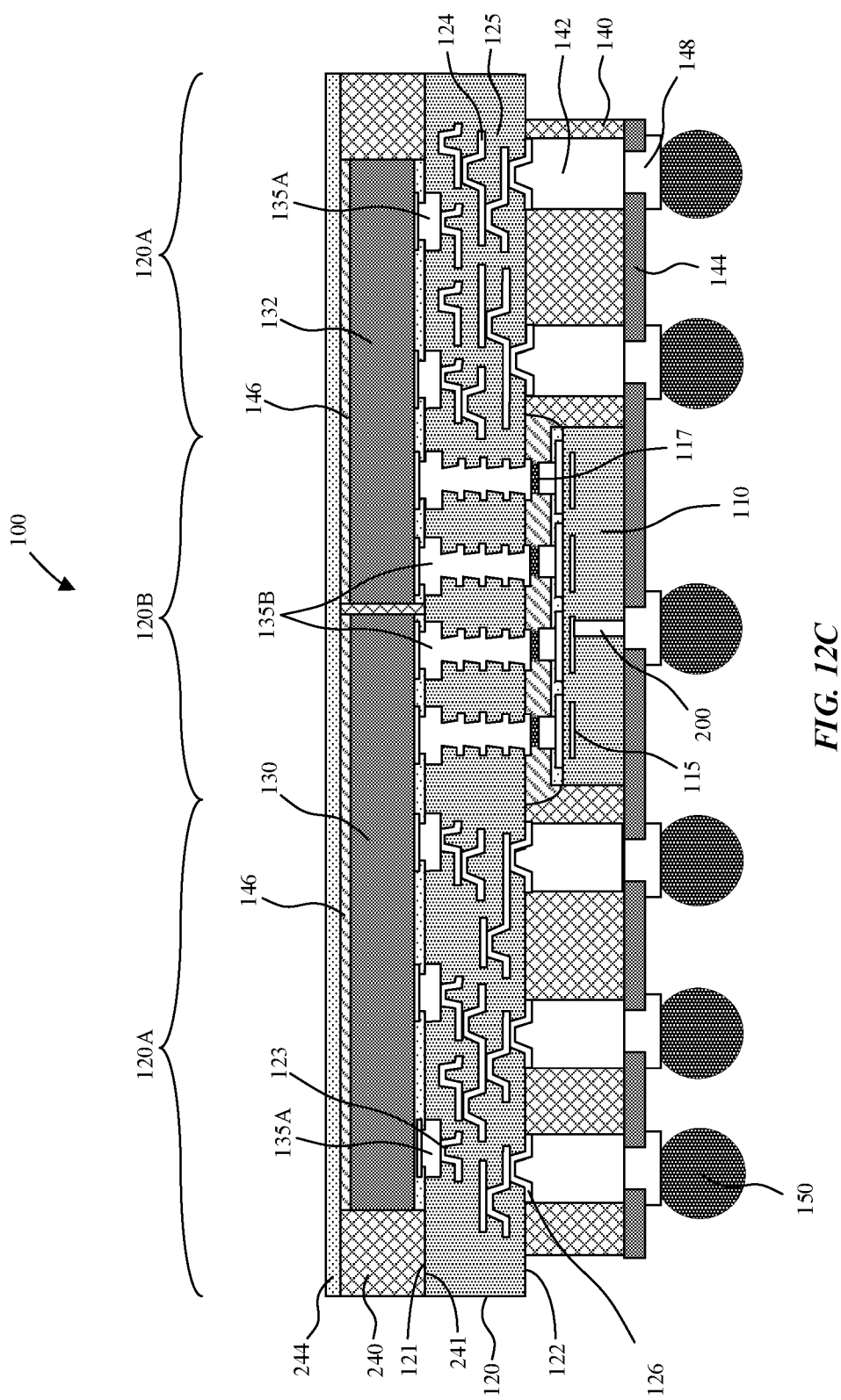
FIG. 12C is a cross-sectional side view illustration of multi-component package including an embedded interposer chiplet and redistribution layer in accordance with an embodiment.

FIG. 12C is a cross-sectional side view illustration of multi-component package including an embedded interposer chiplet and redistribution layer in accordance with an embodiment. FIG. 12C is substantially similar to FIG. 12B with the addition of a plurality of conductive pillars 142 extending from the second side 122 of the RDL 120, with the interposer chiplet 110 and the plurality of conductive pillars 142 embedded within an encapsulation layer 140. A protection layer 144 may optionally be formed over the encapsulation layer 140 and the interposer chiplet 110. The protection layer 144 can be patterned, followed by plating or deposition to form landing pads 148. Conductive bumps 150 (e.g. solder bumps, C4) may optionally be formed on the landing pads 148. Alternatively, the package 100 may be further processed where alternative electrical connections are made with the landing pads 148. For example, the package 100 may then be further packaged in an embedded wafer level packaging process. The interposer chiplet 110 may optionally include one or more through vias 200 (e.g. through silicon vias) to connect with landing pads 148 and conductive bumps 150 on a side (e.g. back side) of the interposer chiplet 110 opposite the conductive bumps 117.

Figure 13:
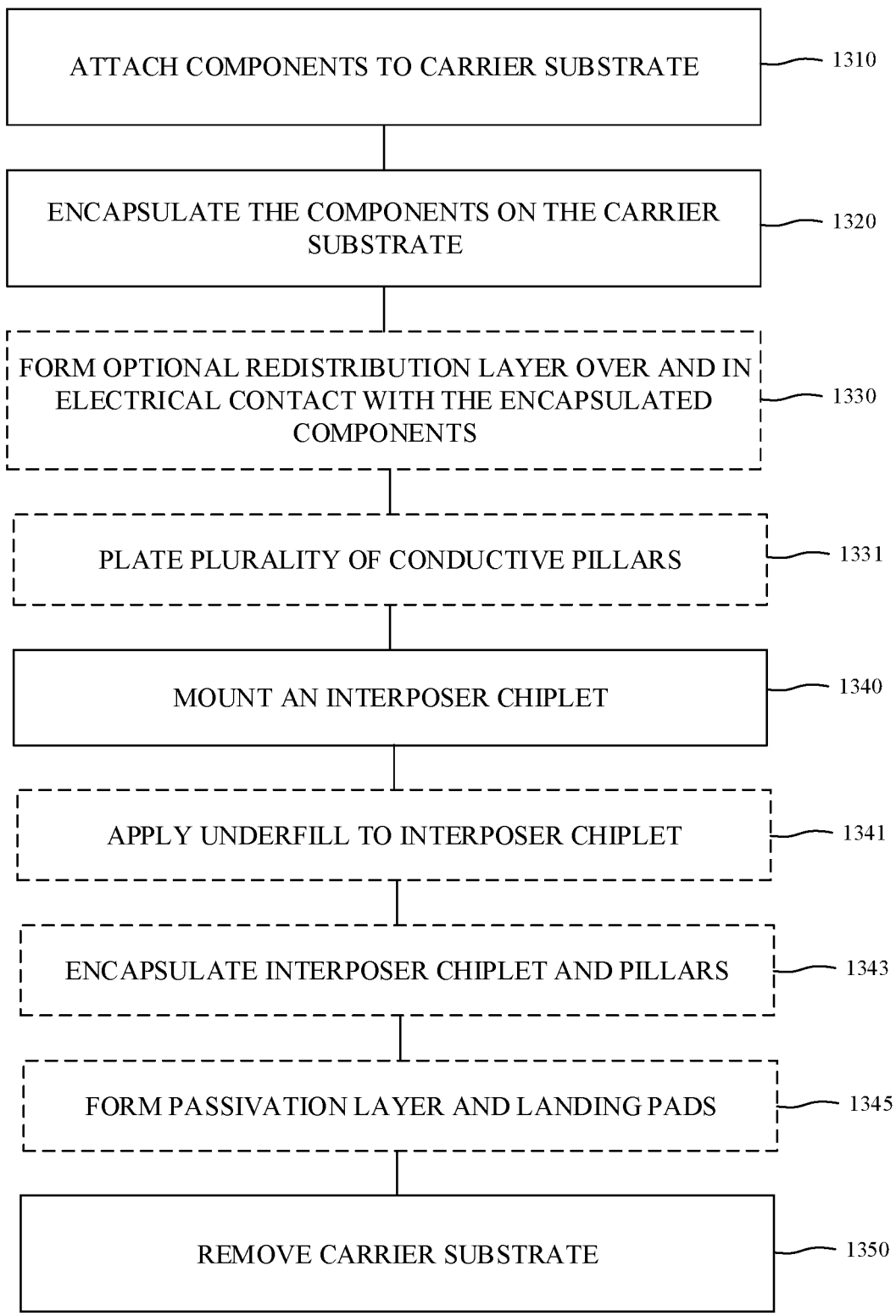
FIG. 13 is a process flow of a method of forming a multi-component package including an interposer chiplet in accordance with an embodiment.

FIG. 13 is a process flow of a method of forming a multi-component package 100 including a interposer chiplet 110 such as that illustrated in FIGS. 12A-12C in accordance with embodiments. At operation 1310 a plurality of components 130, 132 are attached to a carrier substrate 102. For example, this may be optionally be facilitated using die attach films 146. The components 130, 132 are then encapsulated on the carrier substrate 102 with an encapsulation layer 140 at operation 1320. The encapsulation layer 140 may then be planarized. This may optionally expose surfaces of terminals 135A, 135B (e.g. metallic stud bumps). Alternatively, the encapsulation layer 140 may be patterned followed by plating to form metallic stud bumps.

An RDL 120 is then optionally formed over and in electric contact with the encapsulated components 130, 132, or more specifically the terminals 135A, 135B at operation 1330. In an embodiment, the RDL 120 includes contact pads 123 formed directly on the first plurality of terminals 135A of the first and second components 130, 132. The RDL may additionally include stacked vias 127 formed directly on the second plurality of terminals 135B of the first and second components 130, 132. Such a fabrication sequence may mitigate warping associated with the first and second components 130, 132, in particular as associated with avoiding reflow during mounting and thin first and second components 130, 132. Multiple stacked or offset vias 127, redistribution lines 124 and passivation layers 125 can be formed within RDL 120 using a sequence of deposition and patterning. In an embodiment, the RDL 120 includes contact pads 126 (e.g. UBM pads). Contact pads 126 may also be formed on the last stacked or offset via 127. A plurality of conductive pillars 142 may then be optionally plated from the second side 122 of the RDL 120 at operation 1331. The conductive pillars 142 may be plated on the contact pads 126. At operation 1340, an interposer chiplet 110 is mounted using a suitable technique such as flip chip bonding. In an embodiment, bonding is achieved with a plurality of conductive bumps 117 (e.g. micro-bumps; solder).

Following mounting of the interposer chiplet 110, the interposer chiplet 110 may optionally be underfilled at operation 1341 to protect the mechanical or chemical integrity of the bonded structure. At operation 1343, the optional plurality of conductive pillars and interposer chiplet may optionally be encapsulated (e.g. embedded) within an encapsulation layer. Passivation layer 144 and landing pads 148 may optionally be formed at operation 1345. The carrier substrate 202 may then be removed at operation 1350. In an embodiment, an optional protection layer 144 may be formed at various stages. In some embodiments, a plurality of conductive bumps 150 (e.g. solder bumps, C4) can be bonded to/placed on the plurality of contact pads 126. Dicing of individual packages 100 may then be performed, resulting in the structures illustrated in FIGS. 12A-12C.

In utilizing the various aspects of the embodiments, it would become apparent to one skilled in the art that combinations or variations of the above embodiments are possible for forming a package including an interposer chiplet. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A package comprising:
   an encapsulation layer;
   an interposer chiplet embedded within the encapsulation layer;
   a plurality of conductive pillars embedded within the encapsulation layer; and
   a redistribution layer (RDL) spanning over a first side of the encapsulation layer;
   a first component and a second component mounted on a first side of the RDL opposite the encapsulation layer;
   wherein a first plurality of terminals of the first and second components are in electrical connection with the plurality of conductive pillars and a second plurality of terminals of first and second components are in electrical connection with the interposer chiplet through an arrangement of a plurality of interconnects extending through the RDL, each interconnect including a plurality of stacked vias that are stacked in direct contact with one another.

2. The package of claim 1, wherein the RDL comprises a first area of fan out interconnect routing interconnected with the plurality of conductive pillars.

3. The package of claim 2, further comprising a plurality of contact pads on the first side of the RDL, wherein the first and second components are bonded to the plurality of contact pads.

4. The package of claim 3, further comprising a first plurality of conductive bumps connecting the first and second components to the fan out interconnect routing of the RDL, and a second plurality of conductive bumps connecting the first and second components to the arrangement of stacked vias extending through the RDL.

5. The package of claim 4, wherein the first plurality of conductive bumps has a larger pitch than the second plurality of conductive bumps.

6. The package of claim 5, wherein the second plurality of conductive bumps are smaller than the first plurality of conductive bumps.

7. The package of claim 1, wherein the first component is selected from the group consisting of a first die and a first package, and the second component is selected from the group consisting of a second die and a second package.

8. The package of claim 1, wherein the interposer chiplet interconnects the first and second components.

9. The package of claim 8, wherein:
the RDL comprises a first area of fan out interconnect routing interconnected with the plurality of conductive pillars; and
the interposer chiplet includes interposer routing characterized by a finer pitch than the first area of fan out interconnect routing.

10. The package of claim 1, further comprising a back side RDL on the encapsulation layer opposite the RDL.

11. The package of claim 10, wherein the back side RDL includes redistribution lines connected to the plurality of conductive pillars.

12. The package of claim 11, wherein the back side RDL includes a plurality of under bump metallurgy (UBM) pads.

13. The package of claim 12, further comprising a plurality of back side conductive bumps on the plurality of UBM pads.

14. A method of forming a package comprising:
forming a plurality of conductive pillars on a carrier substrate;
attaching an interposer chiplet to the carrier substrate adjacent the plurality of conductive pillars;
encapsulating the interposer chiplet and the plurality of conductive pillars within an encapsulation layer;
forming a redistribution layer (RDL) over and in electrical contact with the encapsulated interposer chiplet and the plurality of conductive pillars, wherein forming the RDL comprises forming a first area of fan out interconnect routing interconnected with the plurality of conductive pillars, and an arrangement of a plurality of interconnects extending through the RDL, each interconnect including a plurality of stacked vias that are stacked in direct contact with one another and are interconnected with the interposer chiplet;
mounting a first component and a second component on the RDL and in electrical connection with the first area of fan out interconnect routing and the arrangement of stacked vias; and
removing the carrier substrate.

15. The method of claim 14, wherein encapsulating the interposer chiplet and the plurality of conductive pillars comprises depositing a molding compound, and planarizing the molding compound to expose the plurality of conductive pillars and landing pads of the interposer chiplet.

16. The method of claim 14, wherein the interposer chiplet includes interposer routing characterized by a finer pitch than the first area of fan out interconnect routing.

17. The method of claim 14, wherein the first component is selected from the group consisting of a first die and a first package, and the second component is selected from the group consisting of a second die and a second package.

18. The method of claim 14, wherein mounting the first component and the second component on the RDL comprises mounting the first component and the second component with a first plurality of conductive bumps connecting the first and second components to the fan out interconnect routing of the RDL, and a second plurality of conductive bumps connecting the first and second components to the arrangement of stacked vias extending through the RDL.

19. The method of claim 18, wherein the first plurality of conductive bumps has a larger pitch than the second plurality of conductive bumps.

20. The method of claim 19, wherein the second plurality of conductive bumps are smaller than the first plurality of conductive bumps.

* * * * *